United States Patent
Cavalcanti et al.

(10) Patent No.: US 10,223,486 B2
(45) Date of Patent: *Mar. 5, 2019

(54) STATIC MODELLING OF AN ELECTRONIC DEVICE

(71) Applicants: Hugo M. Cavalcanti, Austin, TX (US); Alan J. Carlin, Austin, TX (US); Huy Nguyen, Austin, TX (US)

(72) Inventors: Hugo M. Cavalcanti, Austin, TX (US); Alan J. Carlin, Austin, TX (US); Huy Nguyen, Austin, TX (US)

(73) Assignee: NXP USA, Inc., Austin, TX (US)

( * ) Notice: Subject to any disclaimer, the term of this patent is extended or adjusted under 35 U.S.C. 154(b) by 915 days.

This patent is subject to a terminal disclaimer.

(21) Appl. No.: 14/078,853

(22) Filed: Nov. 13, 2013

(65) Prior Publication Data
US 2015/0134305 A1    May 14, 2015

(51) Int. Cl.
G06F 17/50    (2006.01)

(52) U.S. Cl.
CPC .................. *G06F 17/504* (2013.01)

(58) Field of Classification Search
CPC .................................... G06F 17/504
USPC ................................................ 703/2
See application file for complete search history.

(56) References Cited

U.S. PATENT DOCUMENTS

| | | |
|---|---|---|
| 5,913,023 A | 6/1999 | Szermer |
| 6,141,630 A | 10/2000 | McNamara et al. |
| 6,964,029 B2 | 11/2005 | Poznanovic et al. |
| 7,089,542 B2 | 8/2006 | Brand et al. |
| 7,114,111 B2 | 9/2006 | Noy |
| 7,240,243 B2 | 7/2007 | Decker |
| 7,272,752 B2 | 9/2007 | Farchi et al. |
| 7,305,649 B2 | 12/2007 | Bellas et al. |
| 7,370,296 B2 | 5/2008 | Koyfman et al. |
| 7,386,521 B2 | 6/2008 | Adir et al. |
| 7,849,425 B1 | 12/2010 | Hamid et al. |
| 2001/0055123 A1* | 12/2001 | Ryan ................. G06Q 10/06 358/1.12 |
| 2006/0150040 A1 | 7/2006 | Bratt et al. |

(Continued)

OTHER PUBLICATIONS

Non-final Office Action dated Dec. 10, 2014 for U.S. Appl. No. 14/078,857, 22 pages.

(Continued)

*Primary Examiner* — Saif A Alhija (57) ABSTRACT

A design verification system verifies an electronic device design based on a static model of the electronic device. The static model is an expression of the relationships between modules of the electronic device design and relationships between the behaviors of those modules that can be expressed as set of logical relationships. The static model does not rely on a time variable, but instead reflects a fixed set of relationships between the electronic device modules and between behaviors of the electronic device modules. The static model can be employed by a solver, that identifies whether or how the mathematical relationships of the static model can be reconciled, given a set of constraints. The solver results can be analyzed to identify whether there are errors in the device design, such as resource conflicts, failure of the design to achieve a desired configuration, and the like.

20 Claims, 5 Drawing Sheets

(56) References Cited

U.S. PATENT DOCUMENTS

| | | |
|---|---|---|
| 2006/0271345 A1* | 11/2006 | Kasuya ............... G06F 17/5022 703/14 |
| 2009/0249267 A1 | 10/2009 | Cerny et al. |
| 2010/0042963 A1 | 2/2010 | Bruno et al. |
| 2010/0185694 A1 | 7/2010 | Copty |
| 2010/0218061 A1 | 8/2010 | Sinanoglu et al. |
| 2011/0010091 A1 | 1/2011 | Currie et al. |
| 2011/0239182 A1 | 9/2011 | Nitta et al. |
| 2012/0278672 A1 | 11/2012 | Sinanoglu |

OTHER PUBLICATIONS

Liu et al., "A Technique for Test Coverage Closure Using GoldMine", IEEE Transactions on Computer-Aided Design of Integrated Circuits and Systems, vol. 31, No. 5, May 2012, pp. 790-803.
Mottu et al., "Static Analysis of Model Transformations for Effective Test Generation", IEEE 23rd International Symposium on Software Reliability Engineering, 2012, pp. 291-300.
Sanghavi, "What is Formal Verification?", EE Times-Asia, www.eetasia.com, posted May 21, 2010, 2 pages.
Arora, "Enhancing SAT-Based Equivalence Checking With Static Logic Implications", Eighth IEEE International High-Level Design Validation and Test Workshop, Nov. 12-14, 2003, San Francisco, CA, pp. 63-68.
U.S. Appl. No. 14/078,857, filed Nov. 13, 2013, entitled "Monitoring Coverage for Static Modelling of an Electronic Device".
Notice of Allowance dated Jun. 11, 2015 for U.S. Appl. No. 14/078,857, 17 pages.

\* cited by examiner

FIG. 8

STATIC MODELLING OF AN ELECTRONIC DEVICE

CROSS-REFERENCE TO RELATED APPLICATIONS

The present application is related to U.S. patent application Ser. No. 14/078,857, filed on even date herewith and entitled "Monitoring Coverage for Static Modelling of an Electronic Device." the entirety of which is incorporated by reference herein.

BACKGROUND

Field of the Disclosure

The present disclosure relates generally to electronic devices and more particularly to testing and verification of electronic device designs.

Description of the Related Art

A typical design flow for an electronic device includes design verification, where the expected operation of the electronic device is compared to a device specification. Because of the expense of building test devices, the design verification is frequently conducted using automated design tools that simulate the expected operation of the electronic device, as indicated by a data file reflecting the electronic device design (also referred to as a flowchart). Modern electronic devices often can be configured in a variety of different ways, and thus it is typically desirable to simulate operation of the electronic device under a variety of simulated conditions and configurations. However, because of the complexity of modern electronic devices, it can be difficult to efficiently simulate and verify particular configurations of an electronic device that could occur under expected operating conditions.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION OF EMBODIMENT(S)

FIGS. 1-8 illustrate techniques for verifying predicted operation of an electronic device design based on a static model of the electronic device. The static model includes an expression of the relationships between modules of the electronic device and relationships between the behaviors of those modules that can be expressed as set of mathematical relationships. The static model does not include a time variable, but instead reflects a fixed set of relationships between the electronic device modules and between behaviors of the modules. A static model generator automatedly generates the static model based on a data file storing a description of the processor design, such as a hardware description language (HDL) file. The static model can be employed by a tool, referred to as a solver, that identifies whether the mathematical relationships of the static model can be reconciled, given a set of user-defined constraints that indicate a desired configuration, or range of configurations, of the electronic device. The solver results can be analyzed to identify whether there are errors in the electronic device design, such as resource conflicts, failure of the design to achieve a desired configuration, and the like. By using a static model, rather than a dynamic model, the predicted operation of the electronic device design can be more efficiently verified.

To illustrate, conventional verification techniques employ a dynamic model that reflects the predicted operation of an electronic device based on the design under test. The dynamic model includes a time variable, such that the state of the dynamic model evolves based on changes in the time variable. In particular, under conventional verification techniques, an input stimulus is applied to the dynamic model and the dynamic model is allowed to evolve according to its model characteristics and the characteristics of the input stimulus. To test a particular configuration of the device design, a corresponding input stimulus must be applied to the dynamic model. Because a processor can have many different configurations, it can be difficult to identify appropriate input stimuli for all desired configurations of the processor to be tested. Accordingly, verification using dynamic models typically includes a battery of tests using a large set of random input stimuli. However, there is no guarantee that particular configurations of interest will be tested by the set of random input stimuli. In contrast, the input to a solver using a static model is a set of desired goals reflected in the user-defined constraints, wherein the solver gives a yes/no answer as to whether the constraints can be reconciled with the static model. By supplying appropriate constraints to the solver, any given configuration of the processor design can be guaranteed to be verified using the static model. Accordingly, the static model can more flexibly and efficiently test configurations of interest.

As used herein, a "static model" is defined as a model of behavior of hardware, or hardware features of an electronic device, including the behaviors and relationships between the hardware and hardware features under specified conditions, that does not rely on a time variable. That is, the static model does not reflect changes in a processor device over time but instead reflects static relationships between elements of the electronic device. However, the static model can include or imply an order in which particular features or modes of hardware take place. Because the static model is a fixed set of relationships, it implies whether a particular set of inputs and outputs of to the model can be reconciled (made "legal") based on a given set of user-defined constraints. In contrast, a dynamic model does not contain such an implication, but instead simply supplies output data evolved from a given set of input data. Further, in a static model, the state of any particular node representing a module, behavior, or feature of an electronic device can be set using a constraint, without regard to any particular set of inputs or outputs of the device design. Moreover, these constraints are fixed as it is determined by the solver how (if at all) the relationships indicated by the static model can be resolved to satisfy the constraints. In contrast, the states of individual nodes of a dynamic model cannot be individually set, but instead must be established by providing a particular set of input data to the dynamic model. In addition, the state of any particular node is not held fixed by the dynamic model, but instead is allowed to change as the dynamic model evolves in response to the input data.

Figure 1:
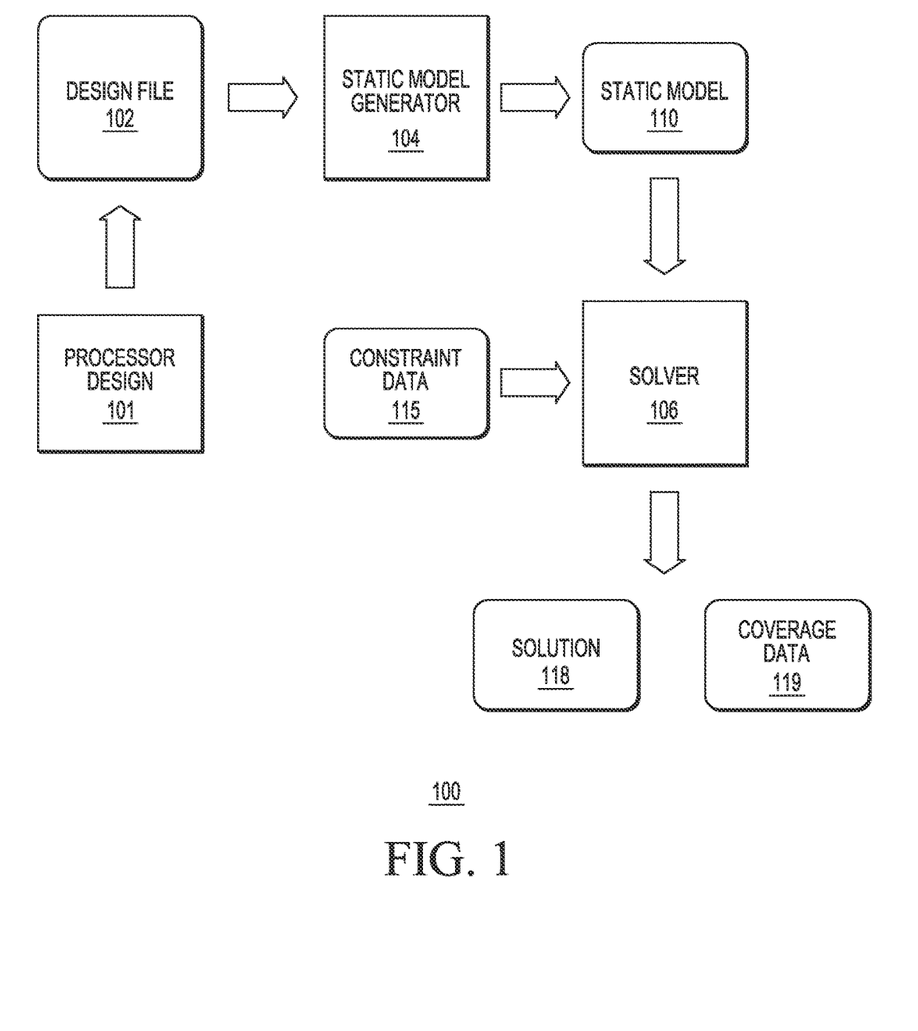
FIG. 1 is a block diagram of a design verification system employing a static model in accordance with at least one embodiment.

FIG. 1 illustrates a design verification system 100 in accordance with at least one embodiment. The design verification system 100 is implemented at a computer system, such as a desktop computer, workstation, server, or combination thereof. The individual modules of the design verification system 100 described below can reflect individual or collective software programs, hardware devices, or combinations thereof. Further although illustrated and described individually, each of the modules described below can represent a portion of a larger software program, hardware device, or combination thereof.

The design verification system 100 is generally configured to verify one or more aspects of an electronic device design. For purposes of description, the design verification system 100 is described with respect to a processor design 101. However, it will be appreciated that the techniques disclosed herein can be applied to other electronic device designs, including integrated circuit designs, system-on-a-chip designs, consumer electronic device designs, and any device design that can be described in the form of a flow chart. In addition, although the design verification system 100 is described in the context of device verification, it will be appreciated that the static modeling techniques described herein can be employed in other contexts, such as validation, generation of register transfer level (RTL) code, and the like.

The processor design 101 reflects the modules of a potential processor device, or portions thereof, the behavior of those modules, and the relationships between the modules and their behaviors. The processor design 101 can be a data file, a written set of device specifications, a conceptual framework for processor, or a combination thereof. In at least one embodiment, the processor design 101 is instantiated as a design file 102 that embodies a flowchart or decision tree that describes features of a processor, or the interpretation of processor features by a designer that created the flow chart or decision tree. For purposes of description, the design file is referred to as a flowchart 102. In at least one embodiment, the flowchart 102 is set forth in a machine interpretable data file, such as a hardware description language (HDL) file in compliance with the Verilog™ hardware description language, that describes the modules, behaviors, and relationships reflected in the processor design 101 in a format that can be interpreted by one or more computer aided design tools. For example, in one embodiment, the flowchart 102 includes a declaration section that identifies each element of the processor design 101, a relationship section that defines relationships between the elements in the flowchart 102, and a behaviors section that reflects behaviors or features of the processor design 101. As used herein, an element of the processor design 101 refers to a module of the processor design 101 at a particular level of granularity. Thus, for example, in at least one embodiment an element of the processor design is a logic gate. In another embodiment an element of the processor can be a higher-order module, such as a processor core or memory controller. The flowchart 102 can represent different elements of the processor design 101 at different levels of granularity. For example, one module of the processor design 101 can be represented at the level of a logic gate, while another module is represented at a higher-order level.

The design verification system 100 includes a static model generator 104 to generate a static model 110 based on the flowchart 102. As described further herein, the static model generator identifies the elements of the flowchart 102, and the relationships between those elements. For example, in at least one embodiment, each element of the flowchart 102 that describes a particular processor module or module behavior or mode is referred to as a node of the flowchart 102. The relationships between the nodes, as indicated by the flowchart 102, are referred to as arcs. The static model generator 104 includes a node parser to identify the nodes as indicated by the declarations section of the flowchart 102. In addition, the static model generator 104 includes a relationships parser that identifies, based on the relationship section of the flowchart 102, arcs between the nodes of the flowchart 102.

Based on the nodes and arcs of the flowchart 102, the static model generator 104 generates the static model 110 to have at least two aspects: a set of node variables and a set of arc variables. Each node variable corresponds to at least one of: 1) an element of the processor design; or 2) a particular mode or behavioral aspect of an element of the processor design. Thus, for example, if the processor design 101 includes a processor core that can be placed in either a low-power mode or an active mode, the node variables of the static model 110 can include one node variable to correspond to the processor core, one node variable to correspond to the low-power mode, and one node variable to correspond to the active mode of the processor core. In at least one embodiment, the static model generator 104 generates the list of node variables as a hierarchical tree, referred to as a node variable tree.

Each of the arc variables of the static model 110 corresponds to a relationship between two node variables, representing a corresponding relationship between nodes of the flowchart 102. The node whose node variable is higher in the node tree for a given arc is referred to as the parent node for that arc and the node whose node variable that is lower in the node variable tree is referred to as the child node for the arc. There is typically only one arc between a parent node and a child node. Thus, in the example above, there is one arc between the node corresponding to the processor core and the node corresponding to the low-power mode, and a separate arc between the node corresponding to the processor core and the node corresponding to the active mode. In addition, as described further herein, the arcs and corresponding arc variables can reflect relationships between the behaviors of a given set of processor elements, such as whether a particular element can be placed in a particular mode simultaneously, limits on the number of elements that can access a given element, and the like.

Based on the nodes and the arcs of the flowchart 102, the static model generator 104 generates the static model to include a set of Boolean or logical equations, reflecting potential configurations of the processor design 101. For a child node having a single parent, the corresponding logical equation can have the following general form:

PARENT && ARCS_PARENT->CHILD

This expression indicates that, under a set of test constraints whereby the node corresponding to the node variable PARENT is held to be true for the configuration to be verified (assigning a logical value of 1 to PARENT) and the arcs represented by the arc variables ARCS_PARENT are also held to be true for the configuration to be verified (assigning a logical value of 1 to ARCS_PARENT), the node corresponding to CHILD also is held to be true, and therefore the node CHILD is also assigned a logical value of 1. For purposes of description, the node variable CHILD is said to be "implied" by PARENT and ARCS_PARENT. To illustrate via an example, if PARENT corresponds to a processor core, ARCS_PARENT corresponds to the behavior "is placed in a low-power mode", and CHILD corresponds to the processor core being in a low-power mode, then the above expression states that "If the processor core is true (e.g. exists) in the configuration, and the processor core is placed in a low power mode in the configuration, then the processor core being in a low-power mode is true for the configuration." As described further herein, the logical equations of the static model 110 can also reflect more complex relationships. For example, the logical equations can reflect whether a child having multiple parents can simultaneously be implied by multiple parents and their corresponding arcs.

The design verification system 100 includes a solver 106 to process the logical equations of the static model 110 to generate a solution 118 and coverage data 119. The solution 118 reflects whether, or how, the logical statements reflected by the static model 110 can each be resolved so that there are no logical inconsistencies in the logical equations, based on a set of constraint data 115. The constraint data 115 indicates which node variables and arc variables of the static model 110 should be assigned a logic value of "1", indicating that the corresponding elements and behaviors of the processor design 101 are to be held to be true for purposes of generating the solution 118, and which node variables and arc variables should be assigned a logic value of 0, indicating that the corresponding elements and behaviors are to be held to be false for purposes of generating the solution 118. The solver 106 assigns the indicated logic values to the corresponding elements and arcs in the logic equations of the static model 110, and identifies whether each of the logic equations can be resolved such that there are no inconsistencies in the results of the equations. An inconsistency indicates that the processor design 101, under the set of constraints specified by constraint data 115, is not predicted to operate according to a specification, and therefore that one or both of the processor design 101 and the specification is incorrect. For purposes of description, the solution 118 is said to be an "invalid" solution if the solver 106 identifies an inconsistency. If the solver 106 is able to resolve the logic equations such that there are no inconsistencies, the solution 118 is referred to as a "valid" solution. In at least one embodiment, the solver 106 can generate multiple valid solutions, with each valid solution showing a state of each node variable and arc variable that results in resolution of the logic equations with no logical inconsistencies. Each of the valid solutions thus indicates a valid configuration of the processor design 101 under the set of constraints specified by constraint data 115.

In response to the solution 118 being at least one valid solution, the solver 106 generates coverage data 119 to indicate the logical values assigned to each of the nodes and arcs of the static model 110. The coverage data 119 thereby reflects the particular one or more configurations of the processor design 101 for which valid solutions were identified. The coverage data 119 can therefore be analyzed to identify which configurations of the processor design 101 have been verified.

Figure 2:
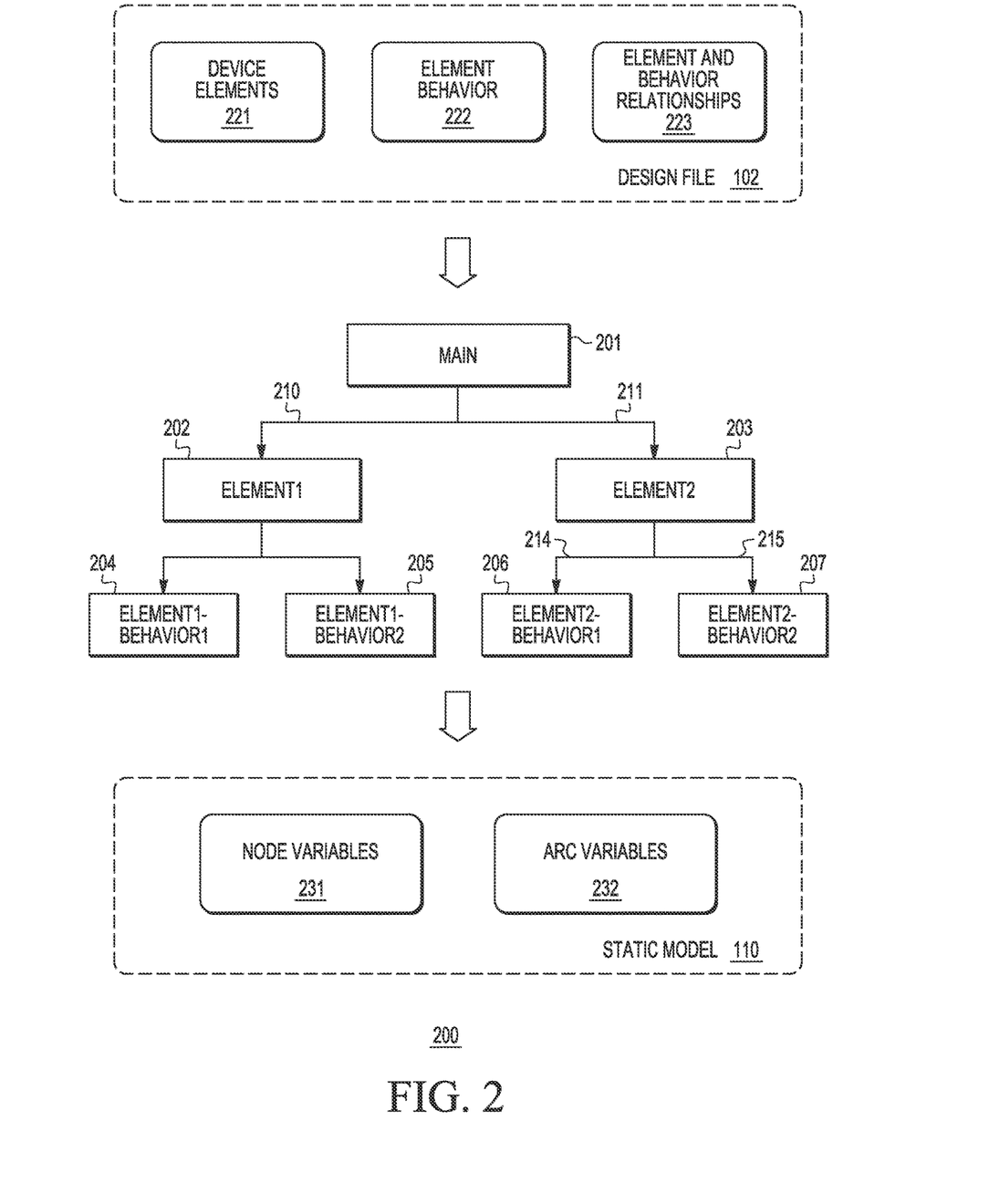
FIG. 2 is a diagram illustrating generation of a static model by the design verification system of FIG. 1 in accordance with at least one embodiment.

Generation of the static model 110 in accordance with at least one embodiment can be better understood with reference to FIG. 2. In the illustrated example, the flowchart 102 includes device elements 221, element behaviors 222 and element and behavior relationships 223. The device elements 221 reflect individual modules of the processor design 101. The device elements 221 can be identified at any desired level of granularity. Thus, in one embodiment, the device elements 221 reflect individual logic gates of the processor design 101. In another embodiment, the device elements 221 reflect "higher-level" components such as processor cores, memory controllers, and the like. The element behaviors 222 indicate the potential behaviors of the device elements 221 reflected in the processor design 101. Thus, the element behaviors 222 reflect aspects of the device elements 221 such as power modes, communication modes, other operational modes, element protocols, and the like. The element and behavior relationships 223 indicate implications of behavior for each of the device elements 221 and element behaviors 222 on others of the device elements 221 and element behaviors 222. For example, if a processor core (a device element 221) is placed in a given power mode (as reflected in the element behavior 222) it can imply that a memory controller (another of the device elements 221) is also placed in the low-power mode (as reflected in the own behavior 222) the implication is reflected in the element and behavior relationships 223.

In at least one embodiment, the static model generator 104 generates the static model 110 by conceptualizing the flowchart (design file) 102 as a chart similar to the illustrated flow chart 200. The flowchart 200 includes nodes 201, 202, 203, 204, 205, 206, and 207. The node 201 is referred to as a "main" or "root" node that provides an entry point for the solver 106 and the static model generator 104. The nodes 202-207 each correspond to one of the device elements 221 or a particular behavior of a device element is reflected in the element behavior 222. Thus, in the illustrated example of flowchart 200 the node 202 reflects the existence of an element designated "ELEMENT 1". Node 204 reflects a particular behavior of ELEMENT 1 and node 205 reflects a different behavior for ELEMENT 1. For example, in one embodiment ELEMENT 1 is a serial communications interface and nodes 204 and 205 reflect the serial communication interface being configured to communicate according to different serial communication protocols.

The flow chart 200 also illustrates arcs 210, 211, 212, 213, 214, and 215, wherein each arc represents a particular relationship between a parent node and one of its children. Thus, for example, arc 210 represents a relationship between parent node 201 and its child node 202, while arc 212 indicates a relationship between parent node 202 and its child node 204. The arcs 232 also reflect relationships between the different children of a parent, as described below with respect to FIGS. 3 and 4.

Figure 3:
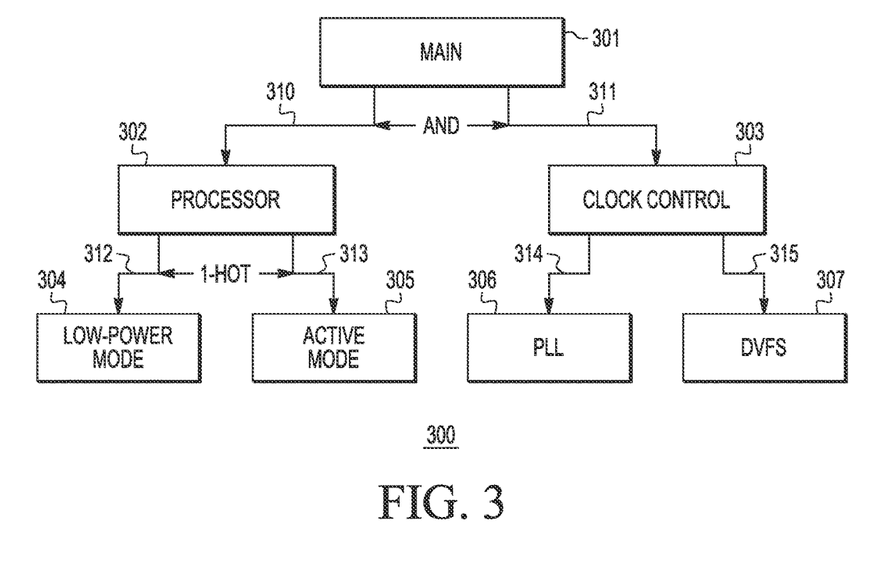
FIG. 3 is a diagram illustrating a static model generated by the design verification system of FIG. 1 in accordance with at least one embodiment.

FIG. 3 illustrates a static model 300 in flow chart form in accordance with at least one embodiment. Each of the illustrated nodes and arcs are represented in the static model 300 as one or more corresponding node variables and arc variables. The static model 300 reflects a processor design, wherein the processor design includes a processor core (reflected by a node 302) that can operate in a low-power mode (reflected by a node 304) and an active mode (reflected by a node 306) and further includes a control module (reflected by a node 303) that can be configured to includes a phase locked loop (PLL) (reflected by a node 306) and a dynamic voltage and frequency scaling module (DVFS) (reflected by a node 307).

The static model 300 also includes arc variables representing arcs 310, 311, 312, 313, 314, and 315. The arc 310 indicates the relationship between the node 301 and the node 302, while the arc 311 indicates the relationship between the node 301 and the node 303. In addition, as illustrated, arcs 310 and 311 are generated to have an AND relationship, to reflect that, if one of the relationships indicated by either of the arcs 310 and 311 is held to exist, then the other one of the relationships is also implied to exist. Correspondingly, if one of the nodes 302 and 303 is held to exist, then the other of those nodes must also be held to exist. This reflects an indication by the flowchart 102 (FIG. 1) that there are no valid configurations of the processor design 101 wherein the processor core is included but the clock control module is not. The AND relationship can be expressed by the static model 110 via the following three logic equations:

MAIN->ARCS_MAIN

MAIN && ARCS_MAIN->P_CORE

MAIN && ARCS_MAIN->CLOCK_CONTROL

In addition, in the example of FIG. 3, the arcs 312 and 313 are generated to have an exclusive-OR (XOR) relationship, also referred to as a "1-HOT" relationship, to reflect that arcs 312 and 313 cannot both be held to exist at the same time (because the processor core cannot be in both the active mode and the low-power mode simultaneously). This 1-HOT relationship can be expressed by the static model 110 via the following logic expressions:

P_CORE->ARCS_P_CORE[0]^ARCS_P_CORE[1]

P_CORE && ARCS_P_CORE[0]->LOW-POWER MODE

P_CORE && ARCS_P_CORE[1]->LOW-POWER MODE where ARCS_P_CORE[0] corresponds to arc 312 and ARC'S_P_CORE[1] corresponds to arc 313. In at least one embodiment, the one-hot relationship can be expressed in the static model 110 in an "encoded" form, whereby it can be represented with a relatively small number of bits, as in the following example:

PARENT==(ARCS_PARENT !=0)

ARCS_PARENT<=2(two children)

(ARCS_PARENT==1)->CHILD1

(ARCS_PARENT==2)->CHILD2

It will be appreciated that in other embodiments other similar relationships with multiple parents and variable numbers of exclusivity can be reflected by the arcs. That is the arcs can reflect an "N-hot" relationship, where N is an integer indicating the maximum number of parents that can be in a true state for the child to be in a true state so that the solver 106 can achieve a valid solution. Further, in at least one embodiment, the arcs can define an M-hot relationship, where M is required to be greater than a minimum limit and smaller than a maximum limit.

In at least one embodiment, one or more of the arcs 310-315 can also indicate that a child node does not exist, based on the state of a parent node. For example, an arc can indicate, in the case of a parent node having a single child, that if the parent node does not utilize the child node, then the child node does not exist (is false) under that configuration. This can be expressed by the static model 110 as follows:

!(PARENT && ARCS_PARENT)->!CHILD

For a child node having two parents, this relationship can be extended, as in the following expression

!((PARENT1 && ARCS_PARENT1)||(PARENT2 && ARCS_PARENT2))->!CHILD

In an embodiment, the relationships indicated by the arcs can be generalized as "pick" type relationship, where the pick relationship requires that, out of P children for a parent node, the parent node implies that at least M, and at most N, of the children nodes are also implied to be true. The pick relationship can be expressed in the static model 110 as follows:

ARCS_PARENT[0]+ARCS_PARENT[1]>=MINI-MUMCHILDREN (M)

ARCS_PARENT[0]+ARCS_PARENT[1]<=MAXI-MUMCHILDREN (N)

PARENT && ARCS_PARENT[0]->CHILD1

PARENT && ARCS_PARENT[1]->CHILD2

If M and N are both "1", the pick relationship reflects the one-hot relationship described above. If M is equal to N, this reflects an N-hot relationship. If P equal to 2 and M and N are equal to 1, the pick relationship reflects the XOR relationship described above. If M and N are both equal to P, the pick relationship reflects the AND relationship described above. If M is equal to "0" and N is equal to P, the pick relationship reflects an ANY relationship, wherein if a parent node is true, all of the children nodes are true.

In at least one embodiment the arcs 232 (FIG. 2) can also reflect special relationships, referred to as "RESOURCE" relationship for a child node having multiple parents. An example is illustrated by static model 400 of FIG. 4, which is based on a portion of a processor design including an input output module (reflected by node 401) having two I/O interfaces (reflected by nodes 402 and 403 respectively). Each of the I/O interfaces has a transmitting mode and a receiving mode (reflected by nodes 403 and 404 for interface node 402 and nodes for 405 and 406 for node 403). Further the processor design indicates that an integrated circuit pin (designated "PIN 1") is used by one of the I/O interfaces in the receiving mode and by the other I/O interface in the transmitting mode. This behavior is reflected by node 407 being described as a "resource" of both nodes 404 and 405 and that the resource can have only 1 parent at a time. Accordingly the arcs between the parent nodes 404 and 405 and the child node 407 indicate a RESOURCE relationship. This RESOURCE relationship indicates that only one of the parent nodes of the node 407 can be in a true state at a time for the solver 106 to reach a valid solution.

Figure 4:
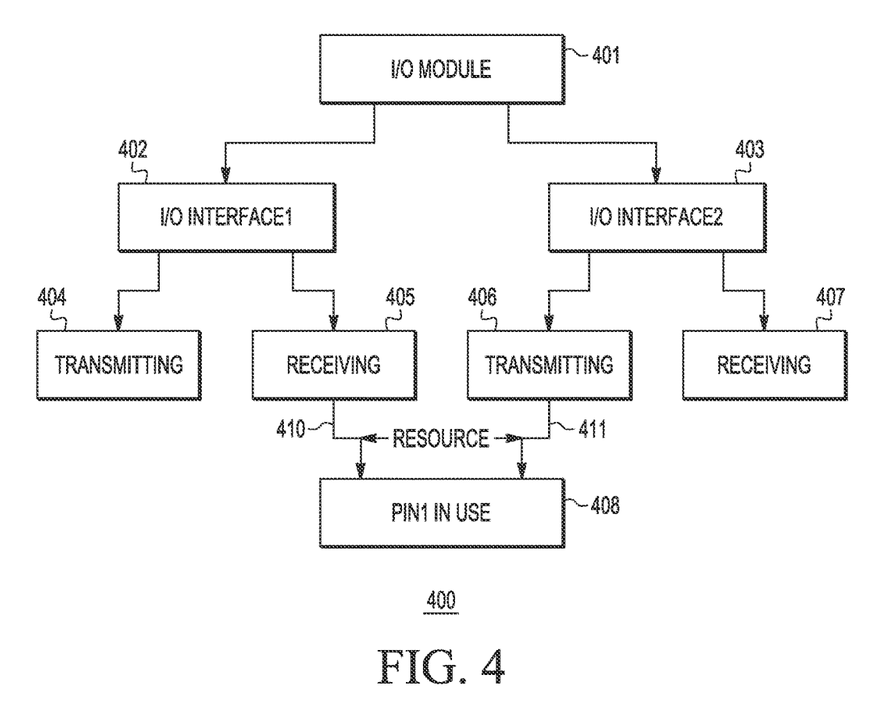
FIG. 4 is a diagram illustrating another static model generated by the design verification system of FIG. 1 in accordance with at least one embodiment.

The RESOURCE relationship can be generalized as follows: for a child node having P parent nodes, no more than R of the P parent nodes can be true when the child node is true, where P and R are integer values. This relationship can be used to indicate that a particular node represents a limited resource, such as an integrated circuit pin, set of communication channels, and the like, that cannot be used by more than R parents.

Figure 5:
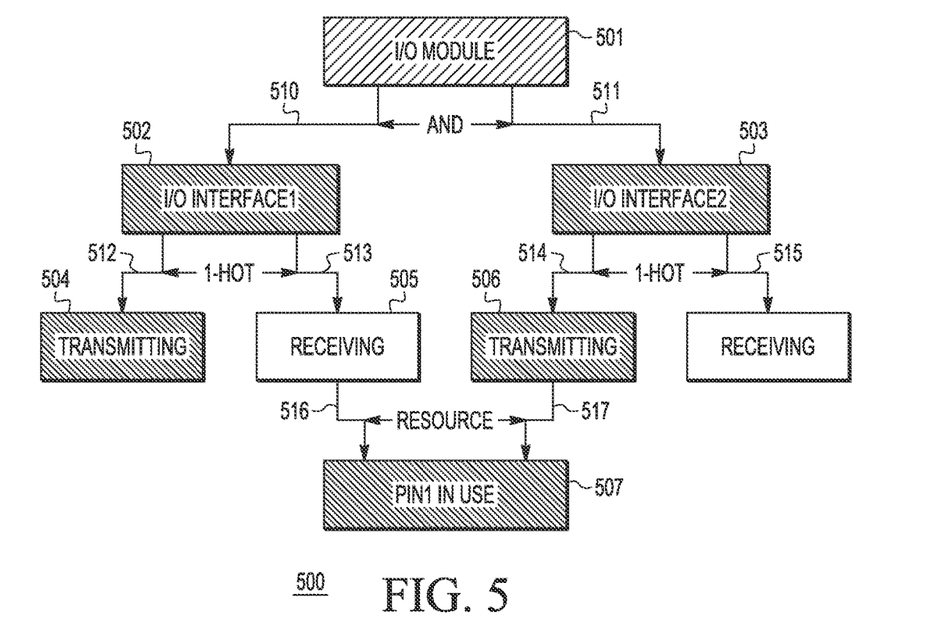
FIG. 5 is a diagram illustrating solving of a static model based on programmable constraints at the verification system of FIG. 1 in accordance with at least one embodiment.

FIG. 5 illustrates a pictorial example of the process used by the solver 106 to identify a valid solution for a static model. In particular, a static model 500 is depicted in accordance with at least one embodiment. The static model 500 reflects a portion of a processor design similar to the portion illustrated by static model 400 of FIG. 4. In the illustrated example of FIG. 5 a node having a light gray background, such as node 501, indicates a constraint applied by constraint data 115 indicating that the element is to be assigned a value of "1" by the solver 106. A node having a dark gray background, such as node 502, indicates the node has been implicated to be in a true state by the solver 106. Accordingly, in the illustrated example of FIG. 5, the solver 106 identifies that the constraint data 115 indicates that node 501 is in a true state, reflecting that the I/O module corresponding to node 501 exists in the processor design for the configuration under test. The solver 106 generates a valid solution by identifying that nodes 502, 503, 504, 506, and 507 can be implied to be in true states by the static model 110, and that each of these nodes can be placed in true states without causing any of the logical equations of the static model 110 to be incorrect. The solver 106 therefore generates the solution 118 to indicate a valid solution.

In addition, the solver 106 generates the coverage data 119 to indicate which nodes were placed in the true state in order to achieve the valid solution. The coverage data 119 can be analyzed to identify the implications of the valid solution. In the example of FIG. 5 the coverage data can be analyzed to identify that the valid solution indicates that the processor design has a valid configuration wherein the I/O interfaces corresponding to nodes 502 and 503 exist in the design and can both simultaneously be in the transmitting modes indicated by nodes 504 and 505, and PIN1 will be in use as indicated by the true state of node 506. The solution generated by the solver 106 is a valid solution because there are no inconsistencies between the results of the logical equations of the static model 110. For example, the AND relationship between arcs 510 and 511, the one hot relationship between nodes 512 and 513, the one-hot relationship between nodes 514 and 515, and the RESOURCE relationship between arcs 516 and 517 are all satisfied by the solution reflected in FIG. 5. In at least one embodiment, the coverage data may not reflect a specific goal, but rather reflect an arbitrary coverage that indicates how often a particular coverage was satisfied, either deliberately or incidentally.

Figure 6:
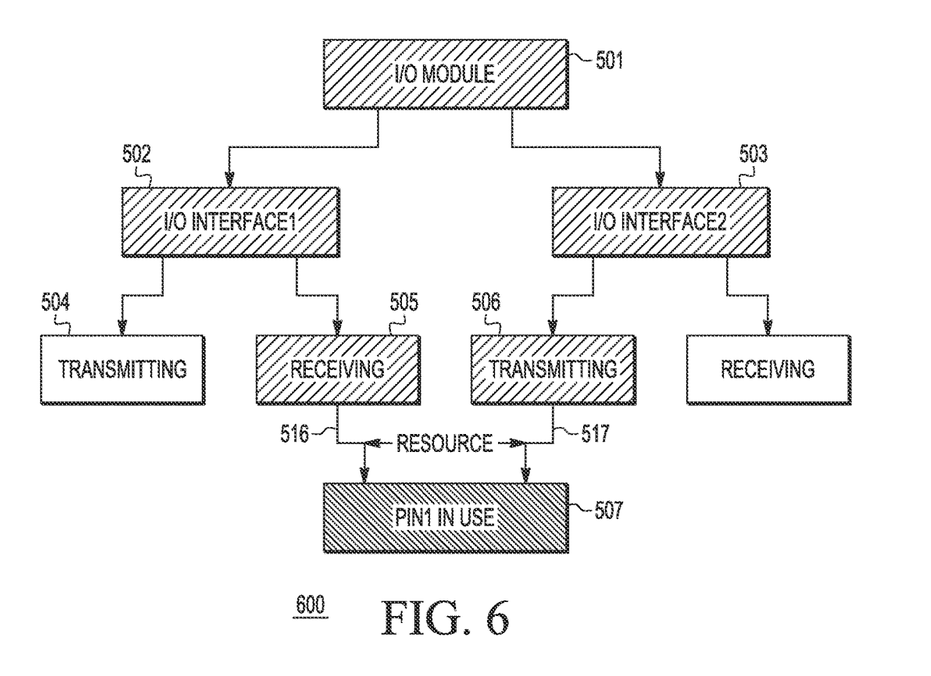
FIG. 6 is a is a diagram illustrating another example of solving of a static model based on programmable constraints at the verification system of FIG. 1 in accordance with at least one embodiment.

FIG. 6 represents a scenario where the solver 106 cannot generate a valid solution based on a set of constraints. In the illustrated example of FIG. 6, the constraint data 115 indicates that nodes 501, 502, 503, 505, and 506 are in true states. Accordingly, the solver 106 indicates, via solution 118, that a valid solution cannot be achieved for this set of constraints and further indicates, via the coverage data 119, that a valid solution cannot be achieved because arcs 516 and 517 both require that node 507 must be placed in a true state, but that the RESOURCE rule indicated by arcs 516 and 517 is violated by nodes 505 and 506 both having a true status. In at least one embodiment, the solver will fail to generate a valid solution when only nodes 505 and 506 are constrained to be in true states. The reverse implications of the corresponding arcs will force their respective parent node (nodes 502 and 503) to be true, thereby also implicating node 501 to be true.

FIG. 6 illustrates how the design verification system 100 of FIG. 1 can be used to verify the predicted operation of a processor device based on a design. In particular, a test engineer can determine that the design should be verified for a condition wherein I/O Interface 1 is receiving data concurrent with I/O Interface 2 transmitting data. Accordingly, the test engineer develops the constraint data 115 (FIG. 1) to set the I/O module (node 501) to a true state, to set the receiving mode (node 505) of I/O Interface 1 to a true state, and to set the transmitting mode (node 506) of I/O Interface 2 to a true state. As explained, under this set of constraints, the solver 106 will indicate an invalid solution and will indicate, via the coverage data 119 (FIG. 1) that the invalid solution resulted from a violation of the RESOURCE relationship between arcs 516 and 517. Based on this indication, the test engineer can determine that the design failed verification because PIN1 was simultaneously used for receiving and transmitting by I/O Interface 1 and I/O Interface 2, respectively. This information can be used by the design team to adjust the processor design so that this condition does not occur. For example, the processor design can be adjusted so that I/O Interface 1 and I/O Interface 2 do not both use PIN1. In another example, I/O Interface 2 can be redesigned so that it checks whether I/O Interface 1 is using PIN1 before it attempts to transmit on the pin. Thus, the use of a static model to verify the behavior of a processor design allows design errors, such as the resource conflict reflected in the example of FIG. 6, to be identified quickly and efficiently. In contrast, a conventional system that employs a dynamic model would require the development of input stimuli that results in I/O Interface 1 transmitting while I/O Interface 2 receives data. Development of such input stimuli can be difficult and time-consuming for complex processor designs. By employing a static model, the design verification system provides an efficient way to verify operation of a device design under given constraints, such as a particular configuration of the device by a customer.

Figure 7:
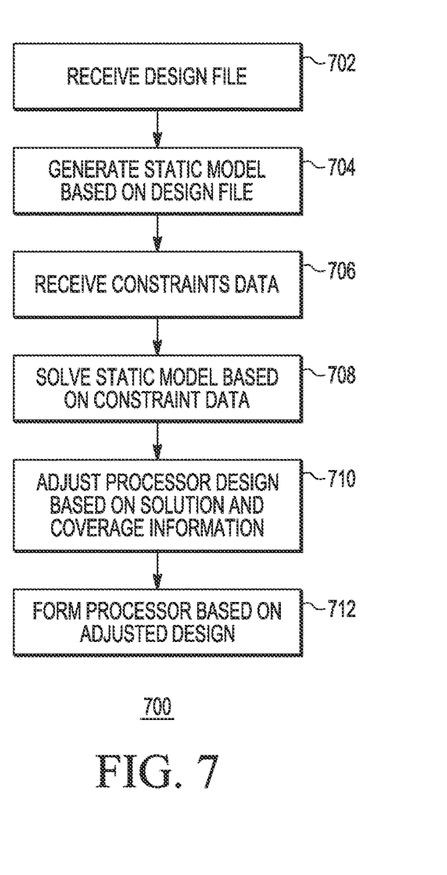
FIG. 7 is a flow diagram of a method of verifying an electronic device design based on a static model in accordance with at least one embodiment.

FIG. 7 illustrates a flow diagram of a method 700 of verifying a processor device design in accordance with at least one embodiment. For purposes of description, the method 700 is described in an example context of an implementation at the design verification system 100 of FIG. 1. At block 702, the static model generator 104 receives the flowchart 102. At block 704, the static model generator 104 generates the static model 110 based on the flowchart 102. At block 706 the solver 106 receives the constraint data 115, and at block 708, the solver 106 solves the static model 110 based on the constraint data 115 to generate the solution 118 and the coverage data 119. At block 710 a design team adjusts one or more of the processor design reflected in the flowchart 102, the flowchart 102 itself, or the constraint data 115, based on the solution 118 and the coverage data 119. For example the solution 118 at may indicate that the static model cannot be solved under the constraint data 115. The design team can analyze the coverage data 119 and the constraint data 115 to identify the causes of the invalid solution and adjust the design to eliminate those causes. At block 712 a processor is formed based on the adjusted design.

Figure 8:
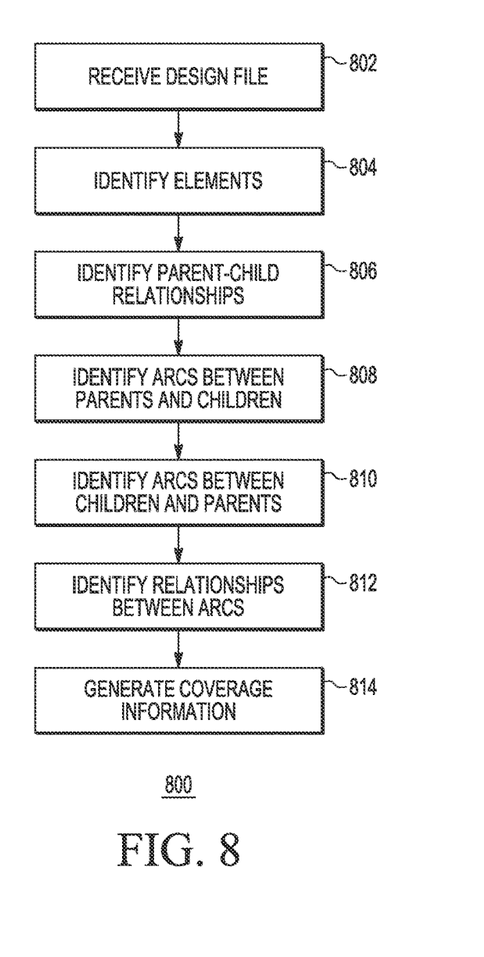
FIG. 8 is a flow diagram of a method of generating a static model based on a flowchart in accordance with at least one embodiment.

FIG. 8 illustrates a flow diagram of a method 800 of generating a static model based on a flowchart in accordance with one embodiment. For purposes of description the method 800 is described with respect to an example implementation at the design verification system 100 of FIG. 1. At block 802 the static model generator 104 receives the flowchart 102. At block 804 the static model generator identifies each of the processor elements reflected in the flowchart 102. At least one embodiment the static model generator 104 creates a linked list identifying each of the elements. At block 806 the static model generator identifies parent-child relationships in the flowchart 102. In at least one embodiment the static model generator 104 parses the description language of the flowchart 102 to identify relationships between elements of the processor and identifies the parent-child relationships based on those identified relationships. In at least one embodiment the static model generator 104 generates a tree structure that reflects the parent-child relationship. For example each node may be stored in a data structure that includes pointers to its children and to its parents in the tree.

At block 808 the static model generator 104 parses the flowchart 102 to identify arcs between parents and their children. Thus, the static model generator 104 identifies whether particular elements, or the behaviors thereof, are implied by each parent, and the relationships between those implications, as described above. At block 810, the static model generator 104 identifies any arcs implied by the relationships of children and their parents. The static model generator 104 may thereby identify arcs that were not reflected in the arcs identified at block 808. For example, the description language of the flowchart 102 may indicate that 2 parents each imply a given child. At block 810, it can be determined that the child itself implies characteristics of the two parents, such as modes of operation, whether it is in a true state because at least one of its parents is pointing to it, and the like. At block 812 to the static model generator 104 identifies relationships between the arcs identified at block 808 and block 810. At block 814 the static model generator 104 generates coverage data, based on the flowchart 102 and the constraint data 115, that can be included in the coverage data 119. For example, the flowchart 102 may itself indicate that certain modes of the static model 110 are always in a true state. This information can be included in the coverage data 119 for improved analysis of the solution 118 and the coverage data 119.

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A computer-implemented method comprising:
generating a static model comprising a set of logical equations reflecting one or more potential configurations of elements of a design for a processor, integrated circuit, or system-on-a-chip based on a data file describing the elements of the design for the processor, integrated circuit, or system-on-a-chip and fixed relationships between the elements and between behaviors of the elements that remain unchanged over time;
solving the static model to generate a first solution to verify one or more potential configurations of the elements of the processor, integrated circuit, or system-on-a-chip based on the design, wherein solving the static model comprises identifying whether the logical equations comprising the static model can be resolved so that there are no logical inconsistencies in the logical equations based on a set of constraint data for the one or more potential configurations;
modifying the design based on a plurality of solutions of the static model, the plurality of solutions including the first solution;
storing the modified design at a computer system; and
forming a processor, integrated circuit, or system-on-a-chip based on the modified design, wherein forming comprises manufacturing, fabricating or assembling.

2. The method of claim 1, wherein generating the static model comprises:
generating a set of node variables based on the data file, each node variable in the set of node variables corresponding to an element of the design.

3. The method of claim 1, wherein generating the static model comprises:
generating arc variables to indicate relationships between node variables.

4. The method of claim 3, wherein the static model comprises:
a set of logical relationships between a parent node of the node variables, P child nodes of the parent node, and a set of arc variables associated with the parent node and the P child nodes, the set of logical relationships indicating that if the parent node is in a true state, at least M of the P child nodes and no more than N of the P child nodes are implied to also be in a true state, wherein M, N, and P are each integer values.

5. The method of claim 4, wherein M and N have the same value.

6. The method of claim 4, wherein M and N are equal to P.

7. The method of claim 4, wherein M is 0 and N is equal to P.

8. The method of claim 3 wherein the static model comprises:
a set of logical relationships between P parent nodes of the node variables and a child node of the P parent nodes, the set of logical relationships indicating that if the child node is in a true state, no more than R of the P parent nodes are implied to also be in a true state, wherein P and R are each integer values.

9. The method of claim 1, further comprising:
in response to solving the static model, generating coverage data indicating logical value assigned to node variables and arc variables of the static model for solving the static model.

10. The method of claim 1, wherein the set of constraint data comprises user-defined constraint information indicating node variables and arc variables of the static model that are to be set to a true state for solving the static model.

11. A method, comprising:
receiving a static model comprising a set of logical equations reflecting one or more potential configurations of elements of a design for a processor, integrated circuit, or system-on-a-chip and indicating static behavioral relationships between elements of a design for a processor, integrated circuit, or system-on-a-chip that remain unchanged over time;
solving the static model to generate a first solution to verify specified predicted behavior for one or more potential configurations of elements of the processor, integrated circuit, or system-on-a-chip based on the design, wherein solving the static model comprises identifying whether the logical equations comprising the static model can be resolved so that there are no logical inconsistencies in the logical equations based on a set of constraint data for the one or more potential configurations;
modifying the design based on the first solution;
storing the modified design at a computer system; and
forming a processor, integrated circuit, or system-on-a-chip based on the modified design, wherein forming comprises manufacturing, fabricating or assembling.

12. The method of claim 11, the constraint data indicates that one or more elements of the design are required; and
solving the static model based on the constraint data.

13. The method of claim 12, wherein the constraint data indicates that an element of the design is prohibited.

14. The method of claim 11, wherein the static model includes:
nodes stored in a data structure to indicate relationships between the nodes, the relationships between the nodes indicative of predicted relationships between corresponding elements of the design.

15. A non-transitory computer-readable storage medium embodying a set of executable instructions, the set of executable instructions to manipulate at least one processor to:
generate a static model comprising a set of logical equations reflecting one or more potential configurations of elements of a design for a processor, integrated circuit, or system-on-a-chip based on a data file describing elements of the design for the processor, integrated circuit, or system-on-a-chip and static behavioral relationships between the elements that remain unchanged over time;
solve the static model to generate a first solution to verify one or more potential configurations of the processor, integrated circuit, or system-on-a-chip based on the design, wherein solving the static model comprises identifying whether the logical equations comprising the static model can be resolved so that there are no logical inconsistencies in the logical equations based on a set of constraint data for the one or more potential configurations;
modify the design based on the first solution;
store the modified design at a computer system; and
manufacture, fabricate, or assemble a processor, integrated circuit, or system-on-a-chip based on the modified design.

16. The computer readable medium of claim 15, wherein the instructions to generate the static model comprise instructions to manipulate at least one processor to:
generate a set of node variables based on the data file, each node variable in the set of node variables corresponding to an element of the design.

17. The computer readable medium of claim 15, wherein the instructions to generate the static model comprise instructions to manipulate at least one processor to:
generate arc variables to indicate relationships between node variables that are dependent on a common node.

18. The computer readable medium of claim 17, wherein the static model comprises:
a set of logical relationships between a parent node of the node variables, P child nodes of the parent node, and a set of arc variables associated with the parent node and the P child nodes, the set of logical relationships indicating that if the parent node is in a true state, at least M of the P child nodes and no more than N of the P child nodes are implied to also be in a true state, wherein M, N, and P are each integer values.

19. The computer readable medium of claim 15, further comprising instructions to manipulate at least one processor to:
generate coverage data indicating logical value assigned to node variables and arc variables of the static model for solving the static model.

20. The computer readable medium of claim 15, wherein the set of constraint data indicates node variables and arc variables of the static model that are to be set to a true state for solving the static model.

* * * * *